(12) United States Patent
Takizawa

(10) Patent No.: US 8,466,679 B2
(45) Date of Patent: Jun. 18, 2013

(54) MAGNETIC RESONANCE IMAGING APPARATUS AND METHOD CONFIGURED FOR SUSCEPTIBILITY-EMPHASIZED IMAGING WITH IMPROVED SIGNAL-TO-NOISE RATIO

(75) Inventor: Masahiro Takizawa, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 428 days.

(21) Appl. No.: 12/747,425

(22) PCT Filed: Dec. 16, 2008

(86) PCT No.: PCT/JP2008/072806
§ 371 (c)(1),
(2), (4) Date: Jun. 10, 2010

(87) PCT Pub. No.: WO2009/081787
PCT Pub. Date: Jul. 2, 2009

(65) Prior Publication Data
US 2010/0277172 A1    Nov. 4, 2010

(30) Foreign Application Priority Data
Dec. 25, 2007    (JP) .................................. 2007-331968

(51) Int. Cl.
*G01V 3/00*    (2006.01)
(52) U.S. Cl.
USPC ........................................................ 324/309
(58) Field of Classification Search
USPC ................................. 324/300–322
See application file for complete search history.

(56) References Cited

U.S. PATENT DOCUMENTS

| | | | |
|---|---|---|---|
| 5,408,180 A * | 4/1995 | Mistretta et al. | 324/306 |
| 6,169,398 B1 | 1/2001 | Watanabe et al. | |
| 6,487,435 B2 * | 11/2002 | Mistretta et al. | 600/420 |
| 7,519,412 B2 * | 4/2009 | Mistretta | 600/407 |
| 7,772,847 B2 * | 8/2010 | Zur | 324/312 |
| 7,865,227 B2 * | 1/2011 | Mistretta | 600/413 |
| 7,917,189 B2 * | 3/2011 | Mistretta | 600/410 |
| 2001/0056231 A1 * | 12/2001 | Jesmanowicz et al. | 600/410 |
| 2008/0119721 A1 | 5/2008 | Kimura et al. | |
| 2010/0215238 A1 * | 8/2010 | Lu et al. | 382/131 |

FOREIGN PATENT DOCUMENTS

| | | |
|---|---|---|
| JP | 11-33012 | 2/1999 |
| JP | 2002-253526 | 9/2002 |
| JP | 2008-125891 | 6/2008 |

OTHER PUBLICATIONS

Rauscher et al. (2005), "Nonnvasive Assessment of Vascular Architecture and Function during Modulated Blood Oxygenation Using Susceptibility Weighted Magnetic Resonance Imaging", Magnetic Resonance in Medicine, vol. 54, pp. 87-95.
International Search Report in PCT/JP2008/072806.

* cited by examiner

*Primary Examiner* — Dixomara Vargas
(74) *Attorney, Agent, or Firm* — Cooper & Dunham LLP

(57) ABSTRACT

A susceptibility-emphasized image having a preferable signal-to-noise ratio can be obtained by a method including measuring a plurality of echo signals using the echo planar method, dividing the plurality of echo signals into a first echo signal group and a second echo signal group, acquiring an image data from the first echo signal group while acquiring a mask data from the second echo signal group, and obtaining the susceptibility-emphasized image through use of the image data and the mask data.

15 Claims, 10 Drawing Sheets

F I G . 4
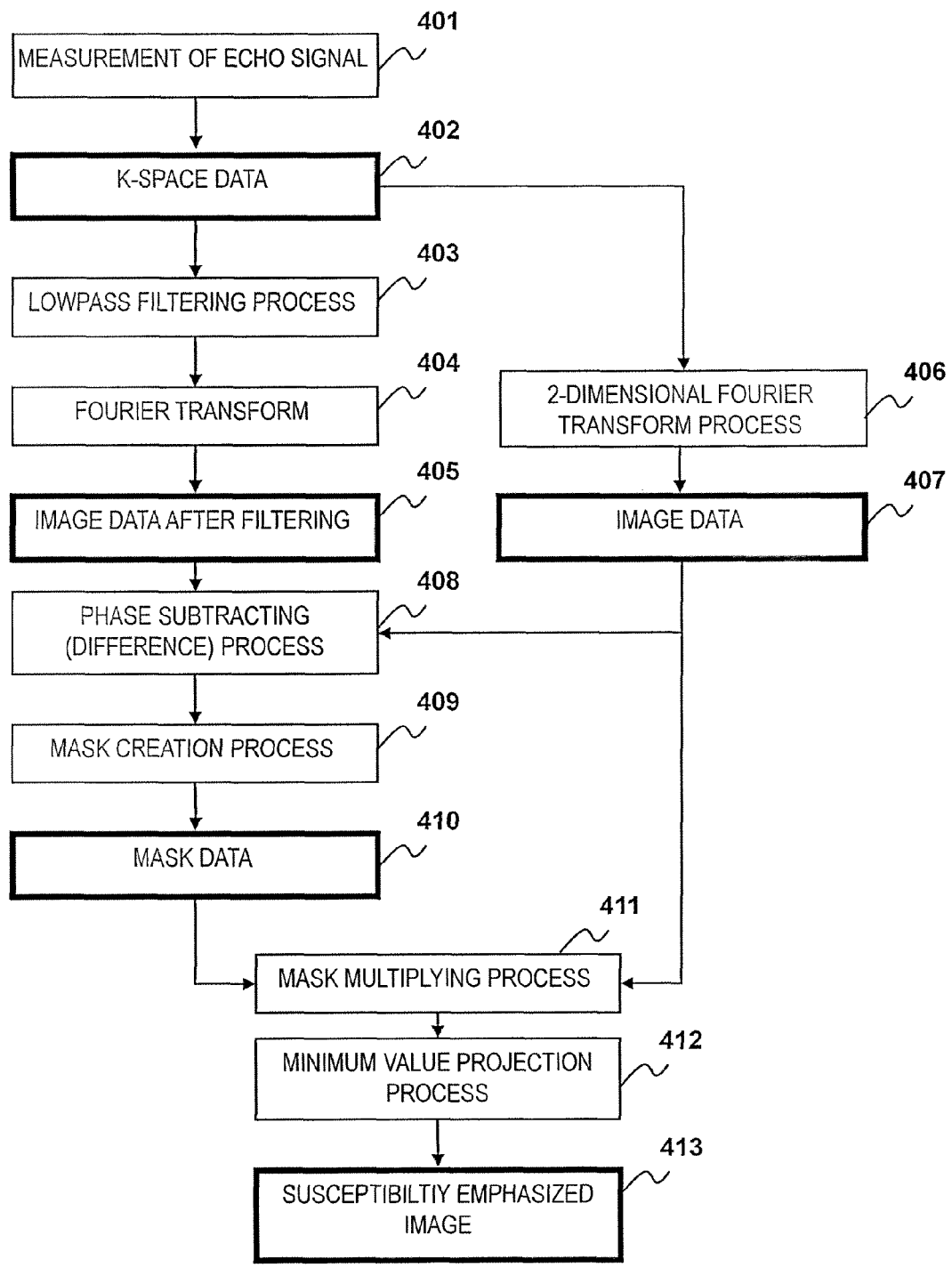

F I G. 5
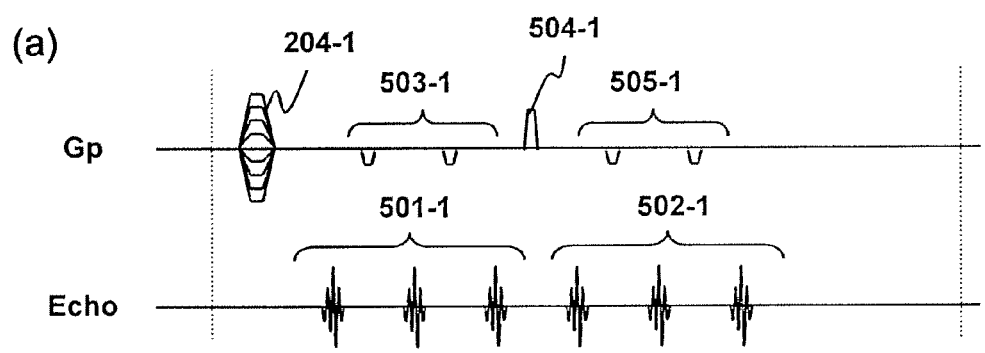
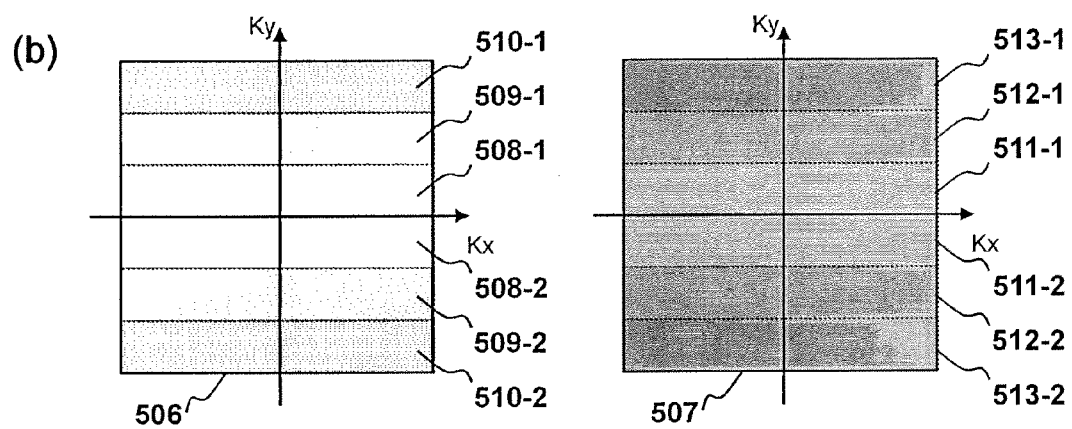

F T : Fourier Transform (a)

(b)

(a)

(b)

MAGNETIC RESONANCE IMAGING APPARATUS AND METHOD CONFIGURED FOR SUSCEPTIBILITY-EMPHASIZED IMAGING WITH IMPROVED SIGNAL-TO-NOISE RATIO

TECHNICAL FIELD

The present invention is related to a technique for acquiring a susceptibility-emphasized image with high speed using a magnetic resonance imaging (hereinafter referred to as MRI) apparatus that acquires a tomographic image of an examination region of an object to be examined utilizing nuclear magnetic resonance phenomenon.

BACKGROUND ART

An MRI apparatus uses a uniform static magnetic field, and the static magnetic field thereof changes locally depending on the magnetic susceptibility of an object. The effect of the local magnetic field change appears in image data as change of a phase. The imaging method that emphasizes the phase change by arithmetic processing is known as susceptibility-emphasized imaging (Patent Document 1). Susceptibility-emphasized imaging has received attention as a method effective for MR angiography of a venous blood vessel, since it is capable of emphasizing magnetic susceptibility due to deox hemoglobin in the blood.

However, since susceptibility-emphasized imaging uses the phase change generated by magnetic susceptibility, the imaging needs the echo signal at a point where it passed about 70 ms from irradiation of an RF pulse. As a result, repetition time (TR) of a pulse sequence (hereinafter simply abbreviated as sequence) can not be set short, whereby taking a long period of time for imaging.

On the other hand, the echo planar method or the fast spin echo method are known as methods for reducing the imaging time in MRI apparatuses by measuring a plurality of echo signals in one time of RF pulse irradiation. Patent Document 2 discloses an example of susceptibility-emphasized imaging using the echo planar method to reduce the imaging time.

Patent Document 1: U.S. Pat. No. 6,501,272
Patent Document 2: U.S. Pat. No. 7,154,269

As mentioned above, magnetic susceptibility can be increased by prolonging the echo time as previously mentioned. In the case that the echo planar method is applied to susceptibility-emphasized imaging, since the echo signal having a long echo time tends to be greatly attenuated, the unsolved problem remains that the signal-to-noise ratio deteriorates when an image is reconstructed from such echo signals.

BRIEF SUMMARY

An approach is provided to obtain the susceptibility-emphasized image having preferable signal-to-noise ratio in the susceptibility-emphasized imaging using the echo planar method in an MRI apparatus.

In an aspect of this disclosure, a magnetic resonance imaging apparatus is provided wherein the apparatus, upon executing measurement of a plurality of echo signals by applying a phase blip gradient magnetic field and inverting the polar character of the frequency encode gradient magnetic field, divides the plurality of echo signals into a first echo signal group and a second echo signal group, acquires image data from the first echo signal group and mask data from the second echo signals group respectively, and obtains a susceptibility-emphasized image from the image data and the mask data. In concrete terms, the MRI apparatus comprises:

a measurement controller configured to control measurement of a plurality of echo signals from an object based on the pulse sequence which applies the phase blip gradient magnetic field and inverts the polar character of the frequency encode gradient magnetic field; and an arithmetic processor configured to obtain a susceptibility-emphasized image using the echo signals, wherein the arithmetic processor divides a plurality of echo signals into a first echo signal group and a second echo signal group, acquires image data from the first echo signal group and mask data from the second echo signal group respectively, and obtains a susceptibility-emphasized image from the image data and the mask data.

Also, the susceptibility-emphasized imaging method of the present invention comprises:

a measurement step that applies a phase blip gradient magnetic field, and controls the measurement of a plurality of echo signals from an object based on the pulse sequence which inverts the polar character of the frequency encode gradient magnetic field; and an arithmetic processing step that obtains a susceptibility image using echo signals, wherein the arithmetic processing step divides the plurality of echo signals into a first echo signal group and a second echo signal group, acquires image data from the first echo signal group and mask data from the second echo signal group respectively, and obtains a susceptibility-emphasized image from the image data and the mask data.

Thus, it is possible to obtain a susceptibility-emphasized image having a preferable signal-to-noise ratio in the susceptibility-emphasized imaging using the echo planar method in the MRI apparatus.

BRIEF DESCRIPTION OF THE DIAGRAMS

FIG. 4 is a flowchart of general susceptibility-emphasized imaging.

FIG. 5 illustrates relative timing and the K-space data, in accordance with a first embodiment of the present disclosure.

DESCRIPTION OF REFERENCE NUMERALS

Figure 1:
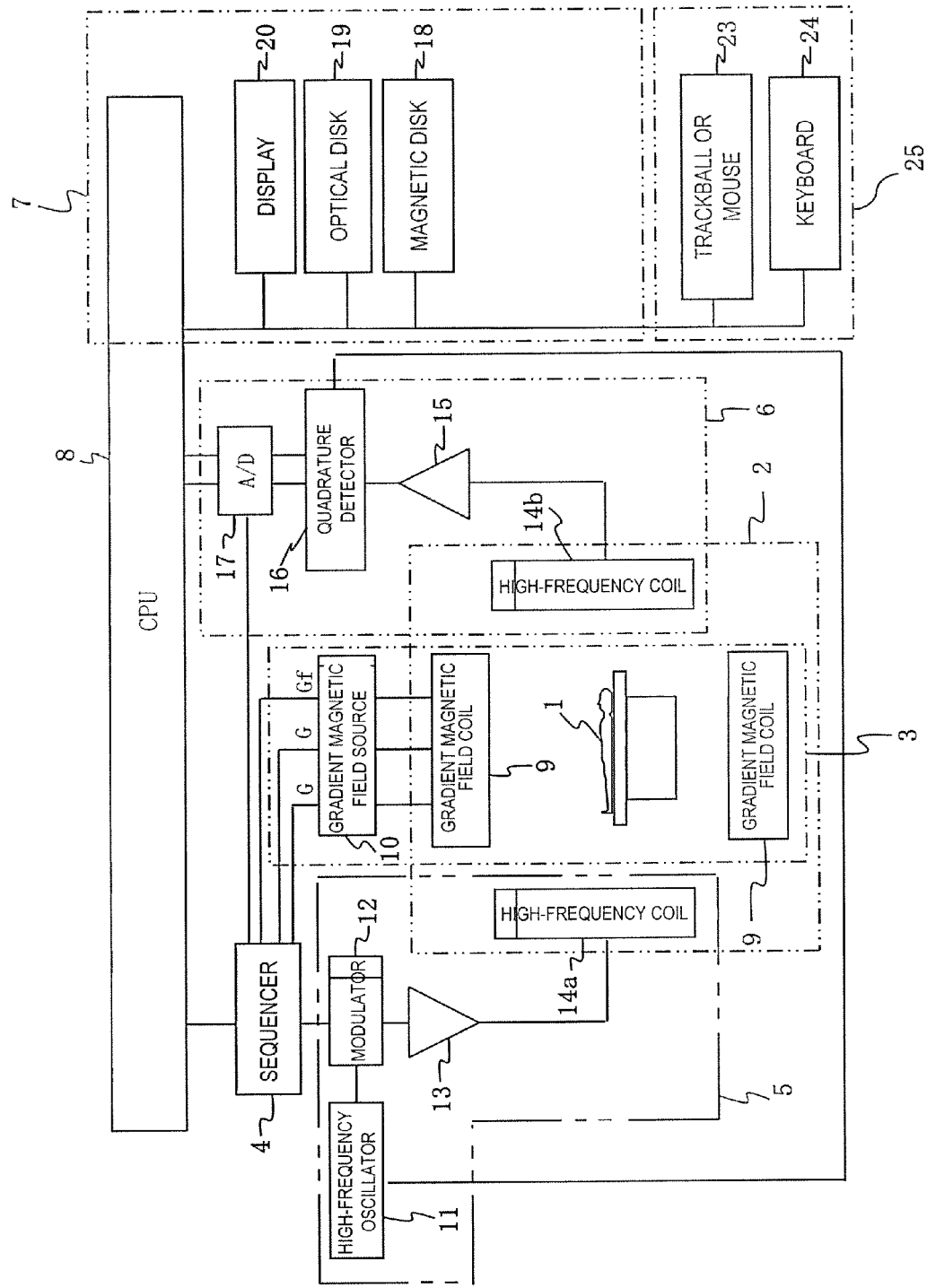
FIG. 1 shows a general configuration of an MRI apparatus that can be adapted for an embodiment of the present disclosure.

1: object, 2: static magnetic field generation system 3: gradient magnetic field generation system 4: sequencer, 5: transmission system, 6: reception system, 7: signal processing system 8: central processing unit (CPU), 9:

gradient magnetic field coil, 10: gradient magnetic field source, 11: high-frequency oscillator, 12: modulator, 13: high-frequency amplifier, 14a: high-frequency coil (transmission side), 14b: high-frequency coil reception side), 15: amplifier, 16: quadrature detector, 17: A/D converter, 18: magnetic disk, 19: optical disk, 20: display, 201: high-frequency pulse, 202: slice selection gradient magnetic field pulse, 203: slice refocus selection gradient magnetic field pulse, 204: phase encode gradient magnetic field pulse, 205: phase blip gradient magnetic field pulse, 206: frequency diphase gradient magnetic field pulse, 207: frequency encode gradient magnetic field pulse, 208: data sample window, 209: echo signal

BEST MODE FOR CARRYING OUT THE INVENTION

Each embodiment of the MRI apparatus related to the present invention will be described based on the attached diagrams. In all of the diagrams, the places having the same function will be appended with the same reference numeral, and the repeated explanation thereof will be omitted.

First, the outline of an example of the MRI apparatus related to the present invention will be described based on FIG. 1. FIG. 1 is a block diagram showing the general configuration of an example of the MRI apparatus related to the present invention. The MRI apparatus is for obtaining a tomographic image of an object to be examined using nuclear magnetic resonance (NMR) phenomenon, and comprises static magnetic field generation system 2, gradient magnetic field generation system 3, transmission system 5, reception system 6, signal processing system 7, sequencer 4 and central processing unit (CPU) 8 as shown in FIG. 1.

Static magnetic field generation system 2 generates a uniform static magnetic field in a space around object 1 in the body-axis direction or in the direction orthogonal to the body axis, and magnetic field generation means of the permanent magnetic method, the normal conductive method or the superconductive method is disposed around object 1.

Gradient magnetic field generation system 3 (gradient magnetic field generation unit) is formed by gradient magnetic field coil 9 wound in three directions of X, Y and Z and gradient magnetic field source 10 for driving the respective gradient magnetic field coils 9, and applies gradient magnetic fields Gs, Gp and Gf to object 1 in 3-axis directions of X, Y and Z by driving each gradient magnetic field source 10 of the respective coils in accordance with the command from sequencer 4 to be described later. More concretely, it applies slice selection gradient magnetic field pulse (Gs) in one direction from among X, Y and Z to set a slice plane with respect to object 1, applies phase encode gradient magnetic field pulse (Gp) and frequency encode (or readout) gradient magnetic field pulse (Gf) in the remaining two directions, and encodes the positional information on the respective directions to an echo signal.

Sequencer 4 is a measurement controller that controls measurement of an echo signal by repeatedly applying a high frequency pulse (hereinafter referred to as an RF pulse) and a gradient magnetic field pulse by a predetermined sequence. Sequencer 4 operates under control of CPU 8, and controls measurement of echo signals by transmitting various commands for measurement of the echo signals necessary for reconstruction of a tomographic image of object 1 to transmission system 5, gradient magnetic field generation system 3 and reception system 6 and controlling these systems.

Transmission system 5 irradiates an RF pulse for generating nuclear magnetic resonance in atomic nuclei spin of atomic elements by which object 1 is formed, and comprises high-frequency oscillator 11, modulator 12, high-frequency amplifier 13 and high-frequency coil 14a on the transmission side. The high-frequency pulse outputted from high-frequency oscillator 11 is performed with amplitude modulation by modulator 12 at the timing commanded from sequencer 4, and an electromagnetic wave (RF pulse) is irradiated to object 1 by amplifying, in high-frequency amplifier 13, the high-frequency pulse which is performed with amplitude modulation and providing it to high-frequency coil 14a disposed in the vicinity of object 1.

Reception system 6 detects the echo signal (NMR signal) emitted by nuclear magnetic resonance of atomic nuclei spin by which biological tissues of object 1 is formed, and comprises high-frequency coil 14b on the reception side, amplifier 15, quadrature detector 16 and A/D converter 17. The electro-magnetic wave (NMR signal) from object 1 responding to the electromagnetic wave irradiated from high-frequency coil 14a on the transmission side is detected in high-frequency coil 14b disposed in the vicinity of object 1, amplified in amplifier 15, divided into two channels of orthogonal signals by quadrature detector 16 at the timing according to the command from sequencer 4, converted into digital amount by A/D converter 17 respectively and transmitted to signal processing system 7. Hereinafter, the echo signal converted into digital amount is referred to as echo signal data or echo data.

Signal processing system 7 has optical disk 19, an external storage device (storage means) such as magnetic disk 18 and display 20 formed by CRT, etc. When echo data from reception system 6 is inputted to CPU 8 (arithmetic processor), CPU 8 executes arithmetic processing such as signal processing and image reconstruction, displays on display 20 a tomographic image of object 1 which is the result of the arithmetic processing, and stores the image in an external storage device such as magnetic disk 18. Also, CPU 8 comprises therein a memory which corresponds to a k-space, for storing echo data. Hereinafter, the description for placing an echo signal or echo data in a k-space means that the echo data is written in and stored in the memory.

Operation system 25 inputs a variety of control information of an MRI apparatus or control information for the process to be executed in the above-mentioned signal processing system 7, and comprises trackball or mouse 23 and keyboard 24. Operation system 25 is disposed in the vicinity of display 20, and an operator interactively controls a variety of processing of the MRI apparatus via operation system 25 while observing display 20.

In FIG. 1, high-frequency coils 14a and 14b on the transmission side and reception side and gradient magnetic field coil 9 are disposed in the static magnetic field space of static magnetic field generation system 2 placed in the space around object 1.

Currently, the kind of spin in an imaging target in an MRI apparatus which is used widely in clinical scenes is proton which is the main component of the object. By imaging spatial distribution of proton density or spatial distribution of relaxation phenomenon of excitation state, the shape or function of a human head region, abdominal region or four limbs can be 2-dimensoinally or 3-dimensionally imaged.

Figure 2:
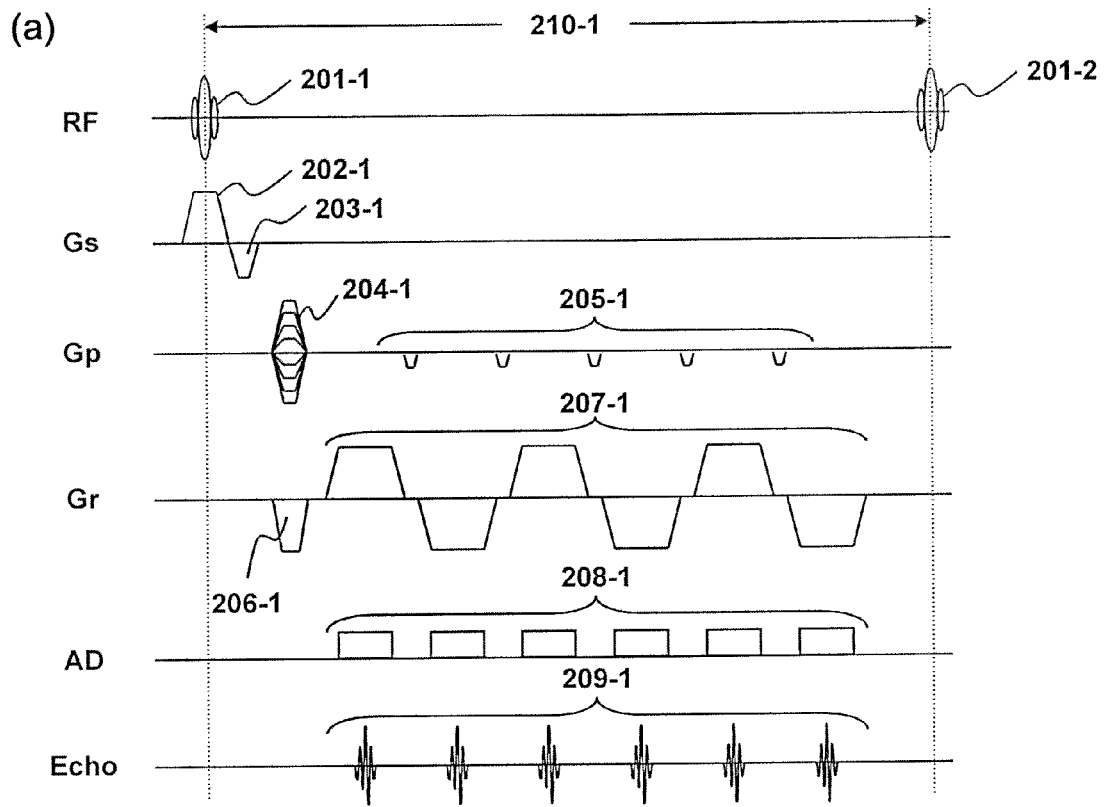
FIG. 2(a) illustrates relative timing of a multi-shot echo planar method of the gradient echo type.
FIG. 2(b) illustrates notionally the K-space data measured by the sequence thereof.
Figure 2:
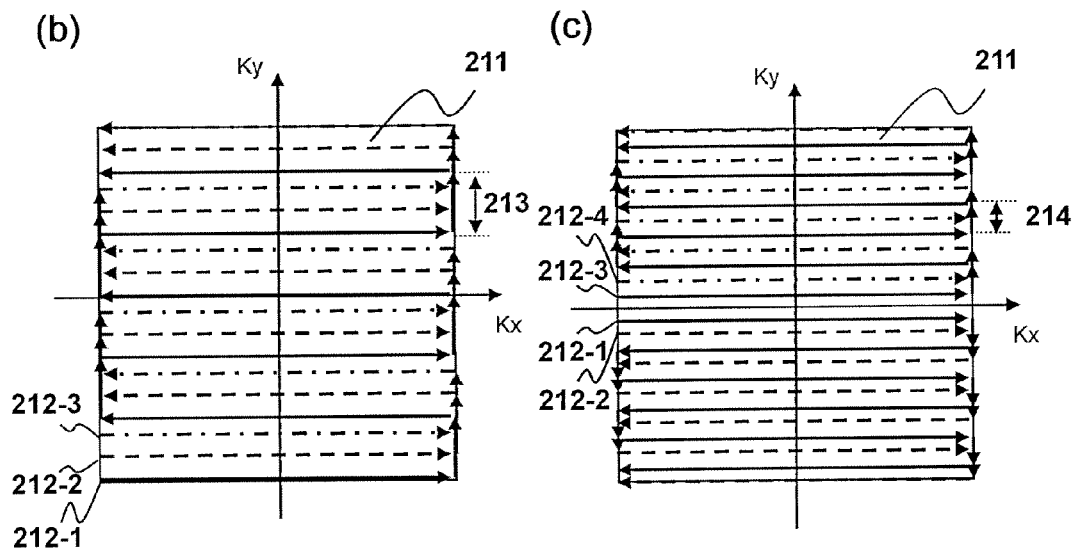

Next, an example of a sequence of the echo planar (EPI) method in MRI apparatus related to the present invention will be described referring to FIG. 2. FIG. 2 is a sequence chart showing the sequence diagram by the multi-shot echo planar method of the gradient echo type, wherein Gs, Gp and Cr indicate the axis of a slice selection gradient magnetic field, phase encode gradient magnetic field and frequency encode gradient magnetic field respectively and RF, AD and Echo indicates an RF pulse, sampling window and echo signal respectively. Also, 201 is an RF pulse, 202 is a slice selection gradient magnetic field pulse, 203 is a slice refocus gradient magnetic field pulse, 204 is a phase encode gradient magnetic field pulse, 205 is a phase blip gradient magnetic field pulse group, 206 is a frequency diphase gradient magnetic field pulse, 207 is a frequency encode gradient magnetic field pulse group, 208 is a sampling window group and 209 is a echo signal group. Sequencer 4 executes measurement of an echo signal by controlling transmission system 5, gradient magnetic field generation system 3 and reception system 6 based on the sequence chart.

In the echo planar method, sequencer 4 measures one echo signal 209 with respect to each readout gradient magnetic field pulse 207 while changing the polar character of readout gradient magnetic field pulse 207 for each irradiation of one RF pulse 201. By repeating the measurement at time interval 201 (repetition time TR), the number of echo signals necessary for image reconstruction are measured. Generally, the number of echo signals necessary for image reconstruction is around 64, 128 and 256 depending on the matrix of the image to be reconstructed. Here, the number following the—(hyphen) denotes the repetition number. FIG. 2(a) shows the first sequence from among a plurality of repetition, and the repeated sequences after the second sequence are omitted since they are the same as the first sequence. The meaning of the number after—(hyphen) will be the same in the sequence chart to be described hereafter.

In this manner, in the echo planar method, since a plurality of echo signals are measured in one RF pulse irradiation, it is possible to obtain images with high speed compared to the sequence that measures one echo signal in one time of RF pulse irradiation. In the case of FIG. 2(a), since 6 echo signals 209 are measured in one irradiation of RF pulse 201, the imaging can be executed six times faster. In the case of the single-shot echo planar method which measures all the echo signals necessary for image reconstruction in one RF pulse irradiation, the imaging can be executed even faster.

FIG. 2(b) is a pattern diagram of an example of K-space 211 where the echo data measured by the echo planar method is placed. Lateral-axis Kx in FIG. 2(b) is equivalent to the time of a sampling window of an echo signal, and vertical-axis Ky is equivalent to the total amount of the phase encode gradient magnetic field pulse applied to the phase encode axis at the point when the echo signal is measured.

Arrows 212 in FIG. 2(b) indicate the order that the echo signal is measured in the K-space data acquired using the echo planar method, and is an example showing that the echo signal is continuously measured from bottom up (from the negative side toward the positive side) in the Ky-axis direction (referred to as the sequential ordering). Lines 212-1 (solid line), 212-2 (dashed line) and 212-3 (chain line) correspond to the echo signal group 209-1, 209-2 and 209-3 measured in repetitions 210-1 (first repetition), 210-2 (second repetition, not illustrated) and 210-3 (third repetition, not illustrated) respectively, and the respective lines indicate that the echo signal is measured at every third lines in the Ky-axis direction.

In FIG. 2(b), the part wherein the arrow of the respective lines 212 proceeds parallel to the Kx-axis corresponds to the echo signals, and 6 echo signals are included in the respective lines 212. Also, the scanning direction of the arrows at the echo signal positions correspond to the polar character of readout gradient magnetic field pulse group 207. Interval 213 (214 in FIG. 2(c)) in the Ky-direction of the arrow corresponds to the area of the respective phase blip gradient magnetic fields 205, and can be placed in the K-space without overlapping echo data in the Ky-direction by changing the starting position of the respective lines 212 using phase encode gradient magnetic field pulse 204.

FIG. 2(c) is a pattern diagram showing another example of K-space 211 in which the echo data measured by the echo planar method is placed. In this case, the K-space is divided in two, above and below by setting Ky=0 as the borderline (the positive and the negative), and the echo signals which correspond to the respective regions are measured (referred to as centric ordering). In this case, data of the echo signal group are continuously placed in the upper side (the positive side) and the lower side (the negative side) of Ky=0 respectively. In other words, the echo data of echo signal groups 212-1 (solid line) and 212-2 (dashed line) are placed in the lower side, and the echo data of echo signal groups 212-3 (solid line) and 212-4 (chain line) are placed in the upper side, respectively and alternately in the Ky-axis direction.

With respect to the such placed 2-dimensional K-space data, CPU 8 applies 2-dimensional Fourier transform and converts them into an image (with respect to the 3-dimensional K-space data, 3-dimensional Fourier transform is applied and the data is converted into a 3-dimensional image). The characteristic of a K-space is that the influence of echo data in the vicinity of the center (Kx=Ky=0, e.g., the echo signal measured where the phase encode is zero or around zero) affects the entire image. In other words, the characteristic of the echo data placed in the vicinity of the center of K-space is reflected in the contrast of an entire image.

On the other hand, the contrast in a local region in an image has a different spatial frequency depending on the size of a target region. For example, the contrast of the region having the size of 1 pixel in an image reflects the contrast of the echo data of the region having the highest spatial frequency in the K-space (e.g., the echo signal measured where the phase encode is the maximum or around the maximum value). Also, the contrast in the region having the size of 10 pixels in an image receives much contribution of the contrast of the data which is at 10 points from the highest spatial frequency in the K-space.

In the method such as the echo planar method, the echo signals measured in the timings having different elapsed time from the time that RF pulse 201 is applied (referred to as echo time) have different contrast information. Given this factor, the echo time, the area of phase encode gradient magnetic pulse 204 and phase blip gradient magnetic field pulse 205 are generally adjusted by sequencer 4 so that the echo data measured at the time which is desired to reflect to the contrast of the image is placed near the center of the K-space.

Figure 3:
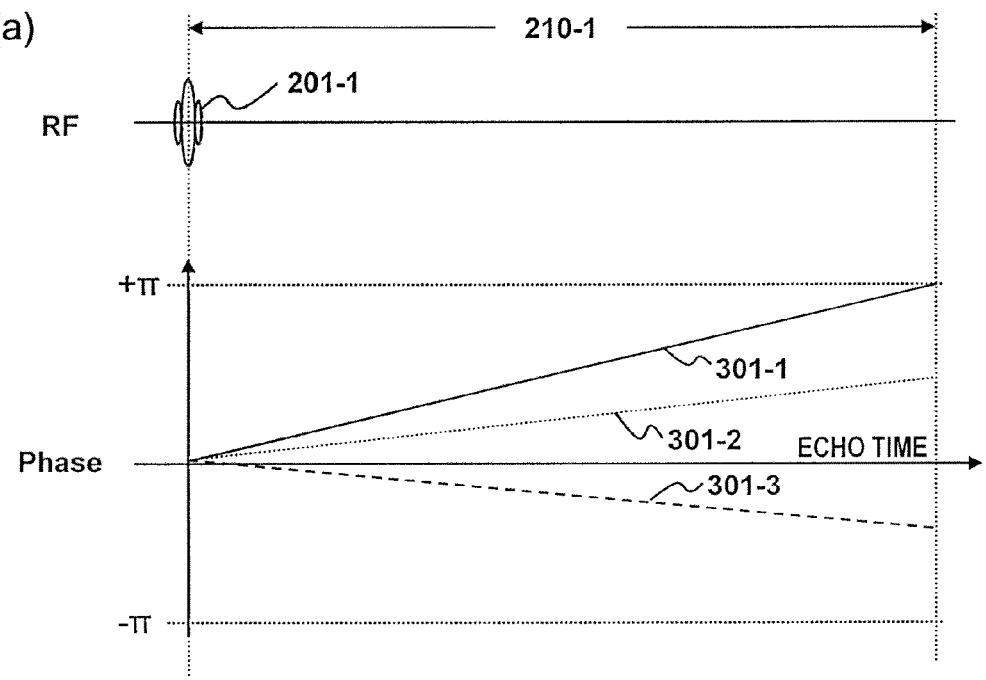
FIG. 3 illustrates notionally change, over time of echo signals by the echo planar method.
Figure 3:
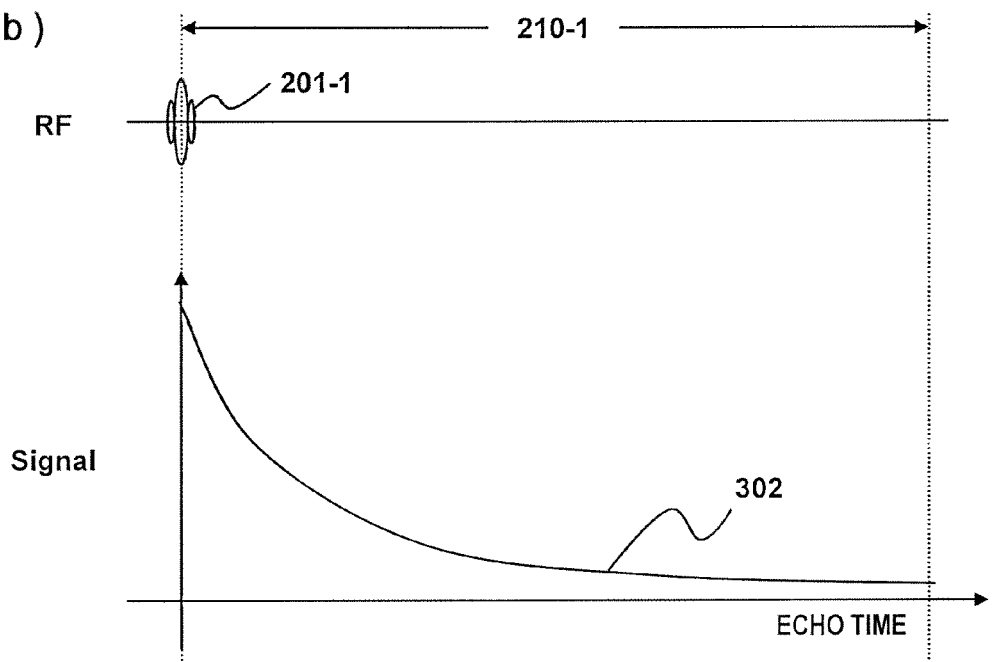

FIG. 3(a) shows the condition of phase rotation generated in an echo signal after the application of RF pulse 201. In an MRI, the phase generated in an echo signal is proportional to the echo time. The phase rotation generated in an echo signal due to the influence of magnetic field inhomogeneity or the difference of magnetic susceptibility is also proportional to the echo time. The 301-1, 301-2 and 301-3 indicate the different phase variation (slope) of the echo signal after applying an RF pulse. Generally, since such magnetic field inhomogeneity or magnetic susceptibility has spatially local variation, the image data varies its phase with respect to every position. In the case of the echo planar method, due to such phase variation, the phase value varies with respect to every echo signal in echo signal group 209.

The peak value of the echo signal acquired in an MRI apparatus becomes a curve like 302 in FIG. 3(b) after applying RF pulse 201. This includes the signal attenuation due to the effect that the phase in the rotation plane of the spin which was uniform right after the application of RF pulse 201 has displaced along with the elapsed time whereby causing attenuation of the echo signal and the effect of transverse relaxation (i.e., $T_2$ relaxation) of the spin itself being excited by RF pulse 201. In this manner, in echo signal group 209 measured by the echo planar method, the difference of the peak values dependent on the echo time is generated.

Next, an imaging flow of a susceptibility-emphasized image by the weighting using a mask which is the base of the present invention will be briefly described. The phase difference is generated in a spin due to the difference in magnetic susceptibility, and the phase difference becomes greater as the echo time gets longer. In order to increase the susceptibility effect, it is preferable to measure the echo signal in a long echo time to make the phase difference of the spin greater. As an example, the echo signal having about 70 ms of echo time is necessary. This magnetic susceptibility is reflected to the phase of the image data reconstructed from the echo signal which is measured by such long echo signal. Given this factor, by generating a mask image to which the magnetic susceptibility is reflected from the phase data of the image and multiplying the generated mask image by the absolute value image, the susceptibility-emphasized image can be obtained wherein the contrast is increased for achieving greater susceptibility effect. Hereinafter, an example of the imaging flow of a susceptibility-emphasized image will be described based on the flowchart shown in FIG. 4. This imaging flow is stored in an external storage device as a program, and CPU 8 or sequencer 4 reads in the flow to the memory as needed to execute it. The sequential imaging flows to be described in the respective embodiments will be executed in the same manner.

In step 401, sequencer 4 drives a pulse sequence for susceptibility-emphasized imaging and controls the measurement of echo signals, and CPU 8 stores the digital data of the measured echo signal in the memory corresponding to the K-space and makes it K-space data 402.

In step 403, CPU 8 performs the filtering (Low-pass filter) on K-space data 402 which passes through the low spatial frequency region.

In step 404, CPU 8 2-dimensionally Fourier transforms the K-space data which is filtered in step 402, and obtains filtered image data 405.

In step 406, CPU 8 generates image data 407 by 2-dimentionally Fourier transforming K-space data 402, in the same manner as a normal reconstruction.

The difference between these two image data 405 and 407 is that image data 407 includes the entire phase information, and filtered image data 405 includes only a broad array of phase information since the phase information corresponding to the high-spatial frequency is eliminated by the filtering whereby also eliminating the local phase information.

In step 408, CPU 8 acquires the phase image from the two image data 405 and 407 respectively and performs phase subtracting (difference) process so as to obtain the phase difference image wherein only local phase information of image data 407 is extracted. Therefore, only the local phase information reflecting the susceptibility effect is extracted in this phase difference image.

In step 409, CPU 8 creates mask data 410 using the weighting function in accordance with the phase amount from the phase data of the phase difference image obtained in step 408. This weighting function is for converting the phase value of a specified range into the value of a specified range (mask value) using a linear function or index function. For example, it is the linear or non-linear conversion function which converts $-\pi \leq \theta \leq 0$ into $0 \leq v \leq 1$ ("θ" is a phase value, and "v" is a mask value).

In step 411, CPU 8 multiplies the created mask data 410 by image data 407 or the absolute value thereof. In this manner, the image multiplied by the mask becomes the image wherein the contrast due to the susceptibility effect is locally improved.

In step 412, in the case of the multi-slice imaging or the 3-dimensional imaging, CPU 8 generates image data multiplied by mask data 410 in step 411 in a plurality of slices respectively, and obtains final susceptibility-emphasized image 413 by performing minimum value projection (MINIP) on the multiplication results. Also, individual slices of 2-dimensional susceptibility-emphasized image may be obtained by omitting the present step 412.

The above-described steps are the imaging flow of the susceptibility-emphasized image by the weighting using a mask, which is the base of the present invention.

In the meantime, as mentioned above, in order to increase susceptibility effect, it is necessary to measure the echo signal of the long echo time for making the phase difference of a spin as great as possible. For this reason, in the susceptibility-emphasized imaging, the imaging takes a long time since the repetition time of the sequence (TR) can not be set short.

While the above-described susceptibility-emphasized imaging using the echo planar method can be proposed for coping with such problem, the necessity for measuring the echo signal of the long echo time is the same when the method is simply combined, thus the echo signal wherein the signal intensity is greatly attenuated must be used, and the signal-to-noise ratio must be deteriorated when an image is reconstructed from such echo signals.

The objective of the MRI apparatus and the susceptibility-emphasized imaging method of the present invention is to solve this problem, and each embodiment thereof will be described below.

First Embodiment

The first embodiment of the MRI apparatus and the susceptibility-emphasized imaging method related to the present invention will be described. The present embodiment divides the echo signal group measured using the echo planar method into a first echo signal group measured in the first half and a second echo signal group measured in the last half, and creates image data from the first echo signal group and mask data from the second echo signal group. The embodiment will be described in detail based on FIG. 5 and FIG. 6.

First, the sequence of the multi-shot echo planar method of the gradient echo type related to the present embodiment and the K-space data acquired using the sequence will be described referring to FIG. 5. FIG. 5(a) shows only phase encode gradient magnetic field axis (Gp) and an echo signal from among the sequences described in FIG. 2(a), and the other sequences are omitted since they are the same as FIG. 2(a). While an example using the echo planar method of a preferable centric order in the measurement of the respective echo signal groups will be described below, the echo planar method of the sequential order may be used without restricting to the centric order.

In the sequence example shown in FIG. 5(a), six echo signals are measured in one RF pulse irradiation 201. In the present embodiment, less or more than six echo signals may be measured. Upon measurement of these echo signals, in order to divide these 6 echo signals into two groups of the anterior side (first half) of 3 echo signals and the posterior side (last half) of 3 echo signals, sequencer 4 combines and executes the preferable sequences for measuring the respective echo signal groups. That is, the present embodiment divides the measured echo signal group into the first half and the last half of the measurement equally, into the two echo signal groups including the same number of echo signals. Hereinafter, the group of the 3 echo signals in the anterior side will be referred to as a first echo signal group, and the group of the 3 echo signals in the posterior side will be referred to as a second echo signal group. While the present embodiment may be divided unequally instead of equally, the example of unequal division will be described later on.

Sequencer 4 makes phase blip gradient magnetic field pulse 503 to be applied upon measuring first echo signal group 501 the same as the sequence shown in FIG. 2(*a*). Then it applies re-phasing gradient magnetic field pulse 504 after measuring first echo signal group 501, and returns the position of Ky in the K-space to the same position of the first echo signal in first echo signal group 501. After that it applies phase blip gradient magnetic field pulse 505 again, and measures second echo signal group 502.

FIG. 5(*b*) is an example that the data of such measured echo signal group is placed in the K-space. CPU 8 creates K-space data 506 for an image by placing the data of first echo signal group 501 in the K-space, and creates K-space data 507 for a mask by placing the data of second echo signal group 502 in the K-space. The respective divided regions in each K-space in FIG. 5(*b*) correspond to each echo time in the echo signal group respectively. More specifically, CPU 8 respectively places the data of the echo signal, from the echo signal having a short echo time to the echo signal having a long echo time, in order of divided regions 508, 509 and 510 in K-space data 506 for an image and in order of divided regions 511, 512 and 513 in K-space data 507 for a mask respectively. Also, the data of the echo signals measured in the first sequence (the number after-(hyphen) is 1) are placed in the Ky-direction on the positive side, and the data of the echo signals measured in the second sequence (the number after-(hyphen) is 2) are placed in the Ky-direction on the negative side (the data will be placed in the same manner in other embodiments to be described later).

In this manner, by dividing the plurality of measured echo data into K-space data 506 for an image and K-space data 507 for a mask, it is possible to create image data 407 using first echo signal group 501 having a short echo time and mask data 410 using second echo signal group 502 having a long echo time. The advantage of using this method is that the magnetic susceptibility of mask data 410 can be greatly increased, since the phase of the echo signal shown in FIG. 3(*a*) is greater in proportion to the echo time. As a result, the contrast by the magnetic susceptibility can be improved. Also, since signal intensity of the echo signal shown in FIG. 3(*b*) decreases as the echo signal elapses, signal intensity of echo signal group 501 for an image measured in the front side of the sequence increases. As a result, it is possible to improve the signal-to-noise ratio of image data 407. Therefore, the susceptibility-emphasized image generated using such K-space data 506 for an image and K-space data 507 for a mask can have an improved contrast due to a preferable signal-to-noise ratio and susceptibility effect.

Next, the imaging flow of the present embodiment for obtaining the respective K-space data using the sequence shown in FIG. 5(*a*) will be described in detail referring the flowchart shown in FIG. 6. The difference from the imaging flow explained referring to FIG. 4 is that the sequence diagram of the echo planar method is changed so as to measure the first echo signal group and the second echo signal group, and the K-space data for a mask and the K-space data for an image are generated from the echo signal groups measured by the echo planar method. Hereinafter, only the steps that are different from the flowchart in FIG. 4 will be described in detail, and the explanation on the steps having the same content will be omitted.

In step 601, an echo signal group is measured using the echo planar method sequence shown in FIG. 5(*a*). As previously described, sequencer 4 is a sequence of the multi-shot echo planar method of the gradient echo type, and it measures echo signal group 602 having a first echo signal group and a second signal echo group using the echo planar method sequence wherein the sequence diagram is changed so as to measure the first echo signal group and the second echo signal group as shown in FIG. 5(*a*).

In step 603, K-space data 604 for a mask and K-space data 605 for an image are generated from echo signal group 602 measured in step 601. CPU 8 divides echo signal group 602 measured in step 601 into first echo signal group 501 measured in the front side of the sequence and second echo signal group 502 measured in the posterior side of the sequence, and generates K-space data 605 for an image from first echo signal group 501 and K-space data 604 for a mask from second echo signal group 502 respectively.

In steps 403~404-1, filtered mask data 405 is created from K-space data 604 for a mask. CPU 8 performs Low-pass filtering with respect to K-space data 604 for a mask in step 403, 2-dimensionally Fourier transforms the filtered K-space data in step 404-1, and creates filtered mask data 405. The details on the respective steps will be omitted since they are the same as FIG. 4.

In step 404-2, mask image data 606 is created from K-space data 604 for a mask. CPU 8 creates mask image data 606 by 2-dimensionally Fourier transforming K-space data 604 for a mask.

In step 406, image data 407 is created from K-space data 605 for an image. CPU 8 creates image data 407 by 2-dimensionally Fourier transforming K-space image data 605 for an image.

In step 408, phase subtracting process is performed on the phase of filtered mask data 405 and the phase of mask image data 606 so as to obtain a phase difference image. CPU 8 obtains the phase from filtered mask data 405, and also obtains the phase from mask image data 605. Then it performs subtracting process on these two phases, and obtains the phase difference image which represents the phase difference data. Since K-space data 604 for a mask has the data of the same spatial frequency as K-space data 605 for an image, mask image data 606 includes all of the phase information that are the same as image data 407. On the other hand, the phase information corresponding to the high-spatial frequency is eliminated from filtered mask data 405 by filtering. Therefore, by the phase difference calculation between the phase of filtered mask data 405 and the phase of mask image data 606, only the phase information corresponding to the high-spatial frequency remains in the phase difference data. In other words, phase difference image is the image representing only the local phase data reflecting the susceptibility effect.

In step 409-413, mask data 410 is created from the phase difference data of the phase difference image obtained in step 408, and susceptibility-emphasized image 413 is obtained from mask data 410 and image data 407. The detail of the respective steps will be omitted since they are the same as FIG. 4.

The detail of the imaging flow of the susceptibility-emphasized imaging related to the present embodiment has been described above. While subsequent flow after mask creating process 409 is the same as the imaging flow of FIG. 4, since the echo signal for mask data 410 is quite difference, susceptibility-emphasized image 413 by the present imaging flow has improved contrast by signal-to-noise ratio and susceptibility effect compared to the susceptibility-emphasized image obtained by the imaging flow in FIG. 4.

As described above, in accordance with the MRI apparatus of the present embodiment, it is possible to reduce imaging time by measuring echo signals using the echo planar method of the present embodiment, and to obtain the susceptibility-emphasized image having a preferable signal-to-noise ratio and contrast due to susceptibility effect by creating image data having preferable signal-to-noise ratio using a first echo signal group with a short echo time and creating the mask data having increased susceptibility effect using a second echo signal group with a long echo time.

Next, some variation examples of the present embodiment will be described.

Figure 7:
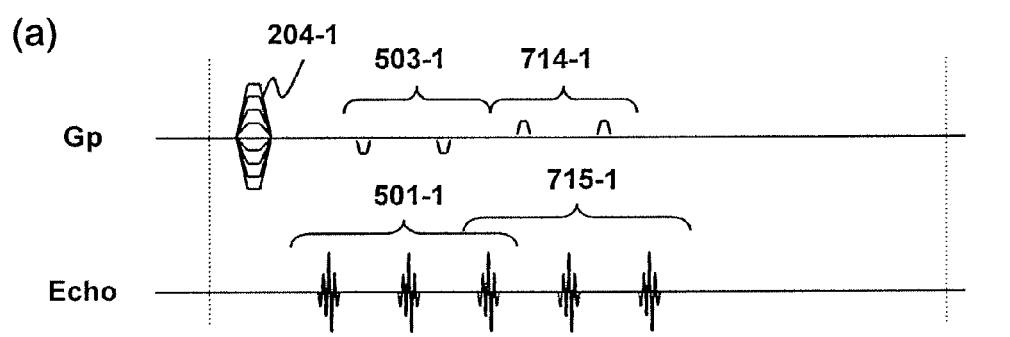
FIG. 7 is for explaining a preferable first variation of the first embodiment.
Figure 7:
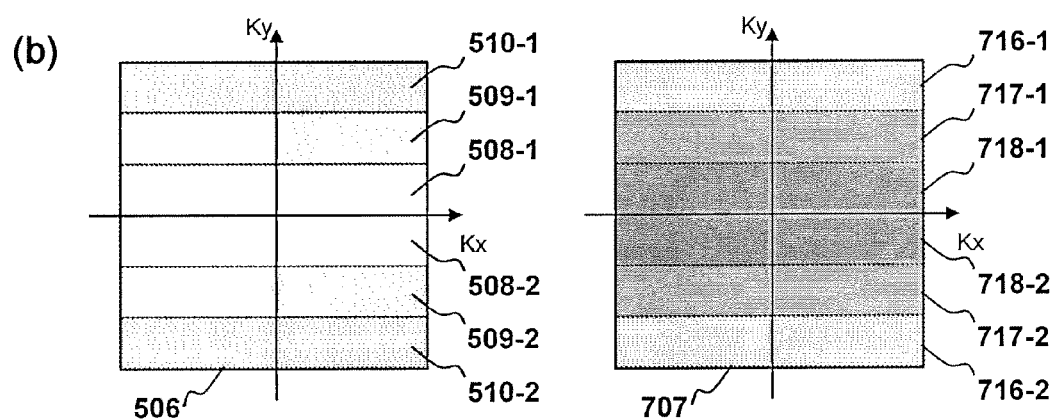

First, the preferable first variation of the present embodiment will be described using FIG. 7. FIG. 7(*a*) shows the sequence diagram of the first variation example, and shows only phase encode gradient magnetic field axis (Gp) and echo signal (Echo) as in FIG. 5(*a*). Display and explanation on the rest will be omitted since they are the same as FIG. 5(*a*). The difference from the sequence in FIG. 5(*a*) is that there is no re-phasing gradient magnetic field pulse 504 before measurement of second echo signal group 715, and polar character of phase blip gradient magnetic field pulse 714 is different. In other words, polar character of phase blip gradient magnetic field pulse 503 to be applied upon measurement of first echo signal group 501 and polar character of phase blip gradient magnetic field pulse 714 to be applied upon measurement of second echo signal group 715 are different. Sequencer 4 controls measurement of an echo signal group based o the sequence shown in FIG. 7(*a*). CPU 8 places the measured echo data in the K-space as shown in FIG. 7(*b*). FIG. 7(*b*) is a pattern diagram of a K-space in which the echo data measured by the sequence of FIG. 7(*a*) is placed, as in FIG. 5(*b*).

In this case, though the measurement order of K-space data 506 and divided regions 508~510 thereof using the data of first echo signal group 501 is the same as FIG. 5(*b*), the measurement order of divided regions 716~718 in the K-space becomes the opposite of divided regions 511~513 in FIG. 5(*b*) since the data of second echo signal group 715 is measured by phase blip gradient magnetic field pulse 714 having the different polar character from the sequence in FIG. 5(*a*). Also, since there is no re-phasing gradient magnetic field pulse 504, the echo signals of first echo signal group 501 and second echo signal group 715 are overlapped. In other words, apart of the measured echo signal group is shared between first echo signal group 501 and second echo signal group 715. As a result, the data of the same echo signal as the highest region 510 in K-space data 506 for an image is placed in the highest region 716 of K-space data 707 for a mask. The above-mentioned overlap can be avoided by measuring two echo signals without applying the phase blip gradient magnetic field pulse between measurements of first echo signal group 501 and second echo signal group 715 to make one out of the two signals the echo signal of first echo signal group 501 and the other signal as the echo signal of second echo signal group 715.

As mentioned above, in accordance with the first variation shown in FIG. 7, it is possible to measure the echo signal group for a mask effectively by eliminating re-phasing gradient magnetic field pulse 504 and setting the size of phase blip gradient magnetic field pulse 714 minimum. Generally, when intensity of the gradient magnetic field pulse to be applied is increased, eddy current or residual magnetic field generated after applying the gradient magnetic field pulse also increases. Therefore, minimizing the output of the phase blip gradient magnetic field pulse as shown in the present variation example is effective to reduce the previously mentioned influences.

Figure 8:
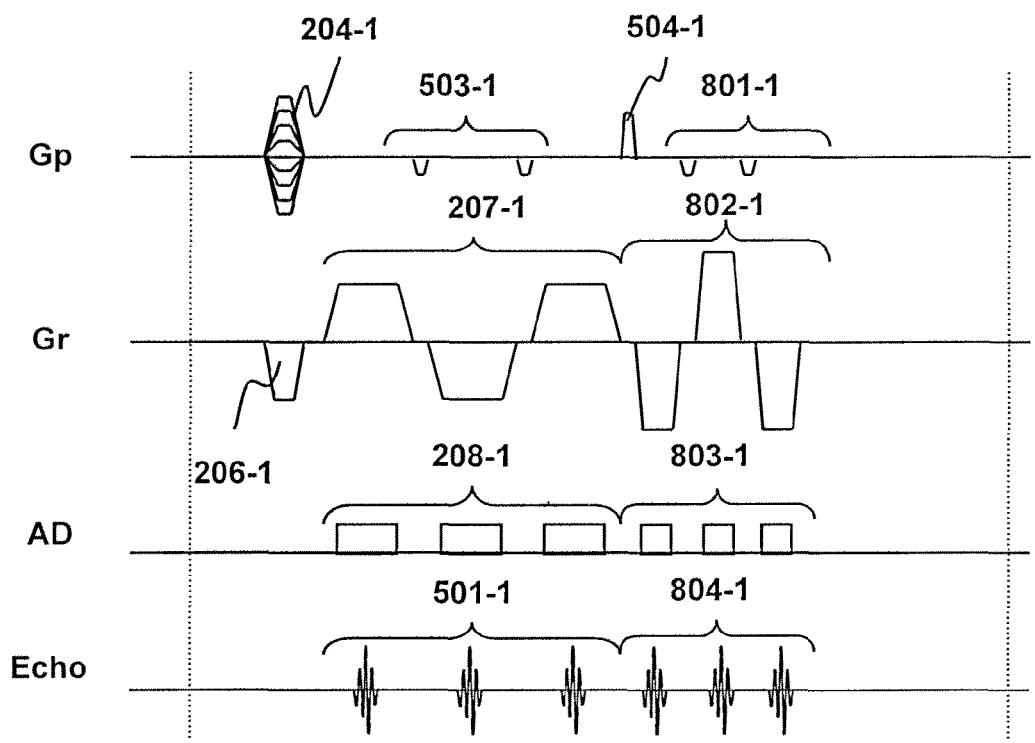
FIG. 8 is for explaining a preferable second variation of the first embodiment.

Next, the preferable second variation example will be described using FIG. 8. FIG. 8 shows a sequence diagram of the second variation example, and shows only phase encode gradient magnetic field axis (Gp), frequency encode gradient magnetic field axis (Gr), sampling window axis (AD) and echo signal (Echo). The difference from the sequence in FIG. 5(*a*) is that intensity of frequency encode gradient magnetic field pulse 802 upon measurement of second echo signal group 804 is great and the application time thereof is shortened, intervals between application times of phase blip gradient magnetic field pulse 801 is shortened, and the time of sampling window 803 is shortened. Further, upon measurement of second echo signal group 804, the reception frequency bandwidth of sampling window 803 is broadened. In other words, compared to frequency encode gradient magnetic field pulse 207 to be applied upon measurement of first echo signal group 501, intensity of frequency encode gradient magnetic field pulse 802 to be applied upon measurement of second echo signal group 804 is greater, the application time thereof is shorter, and the reception frequency bandwidth of sampling window 803 is made wider compared to the reception frequency bandwidth of sampling window 208. Sequencer 4 measures the echo signals while controlling these matters based on the sequence shown in FIG. 8. In accordance with the sequence shown in FIG. 8, it is possible to reduce the repetition time of sequences, since the measurement time of second echo signal group 804 can be reduced.

Even when the time of the sampling window is shortened as described above, if the area of frequency encode gradient magnetic field pulse 207 for first echo signal group 501 and the area of frequency encode gradient magnetic field pulse 802 for second echo signal group 804 are the same, it is possible to generate an image having the same spatial information between the two echo signals groups 501 and 804 by broadening the reception frequency band of sampling window 803.

While the K-space data acquired by the sequence in FIG. 8 has the same configuration as FIG. 5(*b*), since the bandwidth of the sampling window upon acquiring the K-space data is broadened, the signal-to-noise ratio of K-space data 707 for a mask is lowered. However, even if the signal-to-noise ratio of the K-space data is lowered, the phase of the image reconstructed from the K-space can be obtained without depending on the absolute value or signal-to-noise ratio of the K-space data. Therefore, the phase difference data for a mask process to be calculated in the previously mentioned step 408 can be calculated using filtered image data 405 and mask image data 606 which can be acquired from K-space data 707 for a mask.

As mentioned above, in accordance with the second variation example shown in FIG. 8, it is possible to reduce the repetition time of sequences, and also reduce the imaging time compared to the sequence shown in FIG. 5(*a*).

The variation examples of the present embodiment have been described above.

While the example of the sequence of the multi-shot echo planar method is described in the present embodiment, the single-shot echo planar method may be used instead that measures all the echo signals by one time of RF pulse irradiation.

As mentioned above, in accordance with the MRS apparatus and the susceptibility-emphasized imaging method of the present embodiment, it is possible to obtain a susceptibility-emphasized image with a high signal-to-noise ratio and improved contrast of magnetic susceptibility by dividing the echo signal group measured using the echo planar method into two groups, and setting the echo signal group measured on the anterior side of the sequence as the echo signal group for an image and the echo signal group measured in the posterior side of the sequence as the echo signal group for a mask.

Second Embodiment

Next, the second embodiment of the MRI apparatus and the susceptibility-emphasized imaging method related to the present invention will be described. The present embodiment applies a phase blip gradient magnetic field pulse for every two echo signals, and the echo signal group measured in odd-numbered order is set as a first echo signal group and the echo signal group measured in even-numbered order is set as a second echo signal group. The differences from the first embodiment are that the sequence diagram which applies a phase blip gradient magnetic field pulse for every 2 echo signals, and the placement of data in the K-space. The present embodiment will be described below in detail by explaining only the difference from the first embodiment, referring to FIG. 9.

First, the sequence diagram of the present embodiment will be described based on FIG. 9(a). FIG. 9(a) is the sequence diagram of the multi-shot echo planar method of the gradient echo type related to the present embodiment, and shows only phase encode gradient magnetic axis (Gp) and echo signal (Echo) as in FIG. 5(a). Other matters will be omitted since they are the same as in FIG. 5(a). The difference from the sequence in FIG. 5(a) is that phase blip gradient magnetic field pulse 903 is applied upon measuring every two echo signals at the time of measuring echo signal group 904. That is, two echo signals are measured in the same phase encode.

FIG. 9(b) is an example of the K-space in which the data of echo signal group 904 measured based on the sequence shown in FIG. 9(a) is placed. CPU 8, from among the two echo signals measured in the same phase encode, sets the echo signals measured in the odd-numbered order as the first echo signal group and sets the echo signals measured in the even-numbered order as the second echo signal group. CPU 8 places the data of the first echo signal group in the K-space for an image and makes it as K-space data 911 for an image, then places the data of the second echo signal group in the K-space for a mask and makes it as K-space data 912 for a mask.

Figure 6:
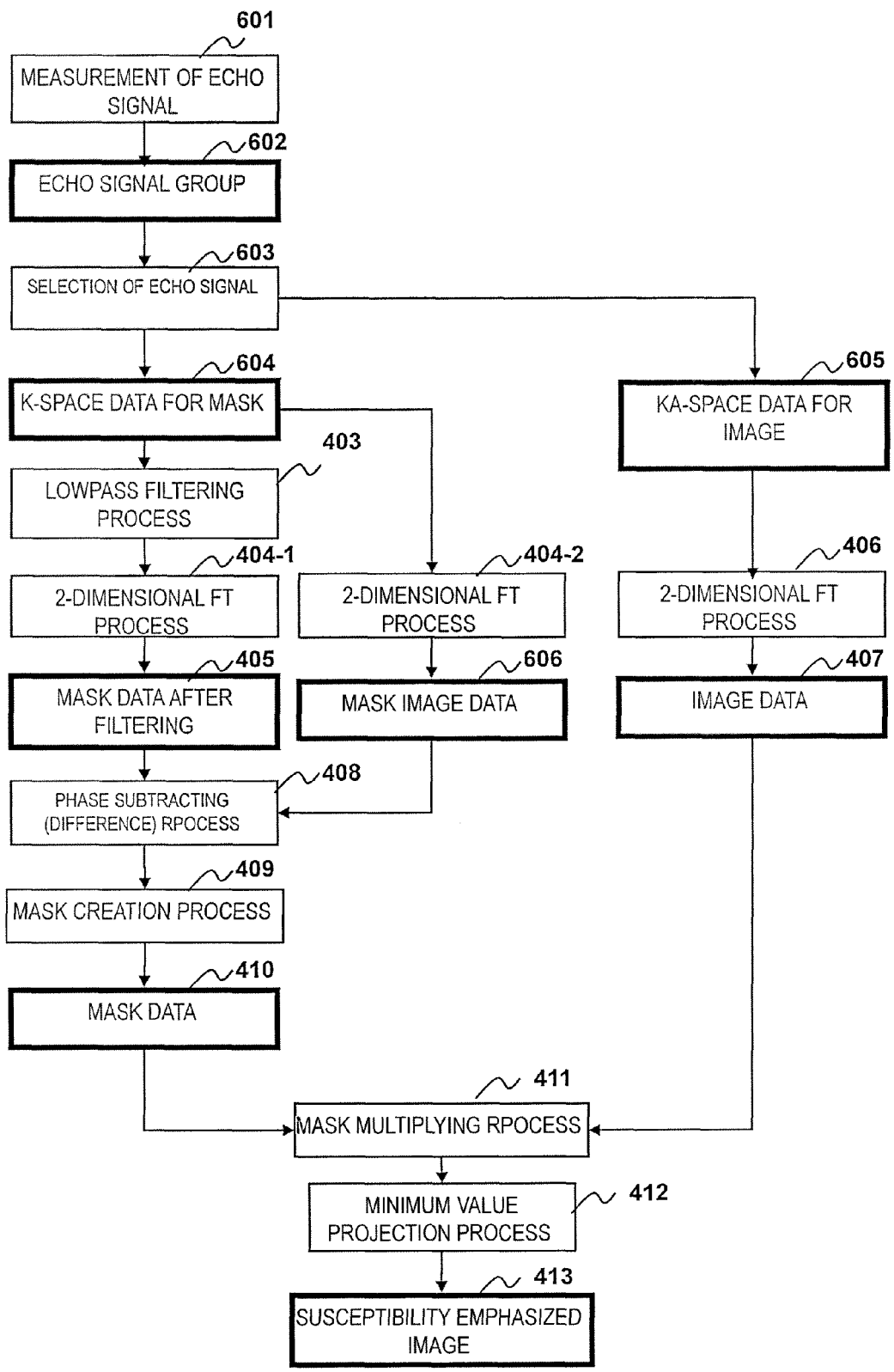
FIG. 6 is an imaging flow related to the first embodiment.

After this step, a susceptibility-emphasized image is obtained based on the imaging flow shown in FIG. 6. Concrete steps thereof will be described below.

In step 601, sequencer 4 controls the measurement of echo signal group 904 based on the sequence shown in FIG. 9(a), and measures echo signal group 602. In step 603, CPU 8, from among echo signal group 602, sets the echo signals measured in the odd-numbered order as the first echo signal group, and sets the echo signals measured in the even-numbered order as the second echo signal group. Then as shown in FIG. 9(b), CPU 8 creates K-space data 911 for an image from the first echo signal group, and K-space data 912 for a mask from the second echo signal group respectively.

The measurement order of the respective divided regions in each K-space is the same as FIG. 5(b). In concrete terms, the data are placed in order from the echo signal having a short echo time to the echo signal having a long echo time respectively, in order of divided regions 905, 906 and 907 in K-space 911 and in order or divided regions 908, 909 and 910 in K-space 912.

Afterward, susceptibility-emphasized image 413 is obtained by CPU 8 executing the imaging flow after step 403 shown in FIG. 6, while replacing K-space data 605 for an image in FIG. 6 by K-space data 912 for an image in FIG. 9(b) and replacing K-space data 604 for a mask in FIG. 6 by K-space data 912 for a mask in FIG. 9(b). The content of process in the respective steps will be omitted since they are the same.

In the same manner as FIG. 8(a), it is possible to reduce the imaging time by raising the intensity of the frequency encode gradient magnetic field pulse and reducing the time a sampling window upon measurement of echo signals for a mask.

Generally in the echo planar method, since an echo signal is measured while the frequency encode gradient magnetic field pulse is being inverted, spatial information of the echo signal measured in the odd-numbered order and the echo signal measured in the even-numbered order are inverted. Therefore, it is necessary to match the spatial information by inverting one of the echo signals in the odd-number order or in the even-number order horizontally (Kx-direction) upon image reconstruction. However, due to the fact such as an accident error of gradient magnetic field pulse upon measurement of echo signals, the peak position of the echo signal measured by the positive frequency encode gradient magnetic field and the peak position of the echo signal measured by the negative frequency encode gradient magnetic field are often displaced. In such a case, because of the mirror-reversed process, there are times that artifacts are generated in an image (generally referred to as N/2 artifact) due to the remained displacement of the echo signal peak positions between the echo signal in the odd-numbered order and the echo signal in the even-numbered order.

Figure 9:
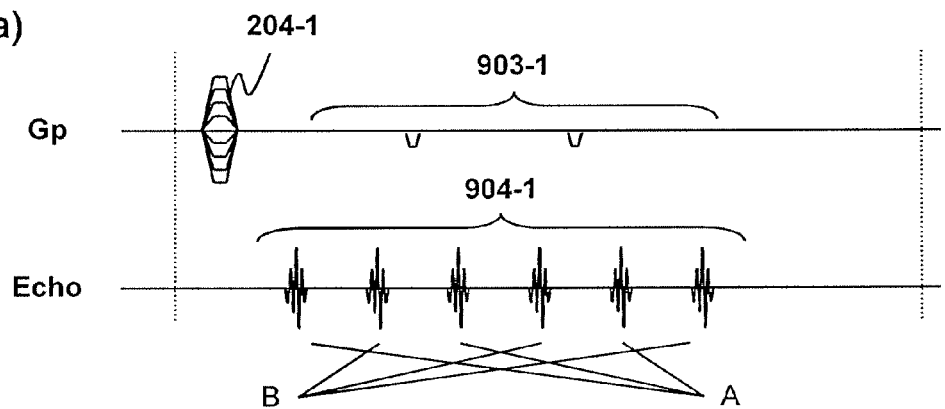
FIG. 9 is for explaining a preferable third variation of the second embodiment.
Figure 9:
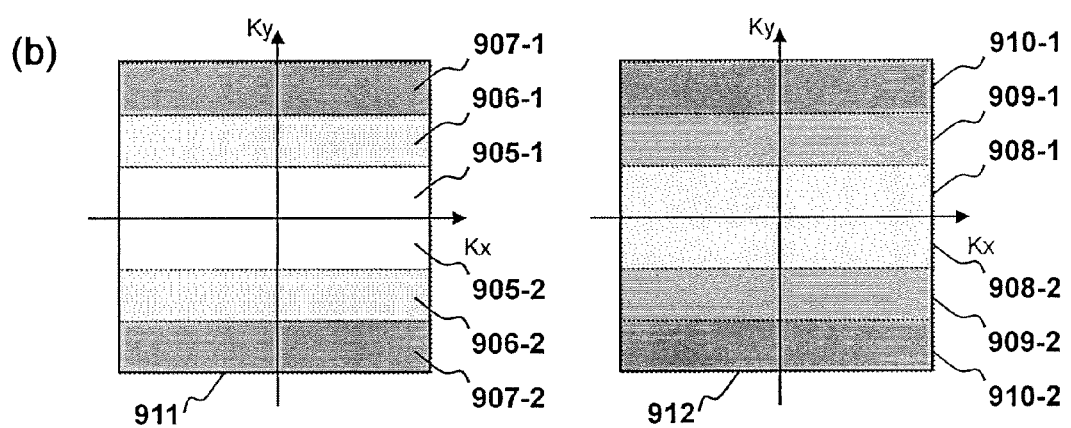

On the other hand, the sequence and the division method of an echo signal group shown in FIG. 9 has an advantage that the above-mentioned N/2 artifacts can be prevented, since K-space data 911 for an image is created using only the echo signals in the odd-numbered order and K-space data 912 for a mask is created using only the echo signals in the even-numbered order respectively.

While an example of the sequence of the multi-shot echo planar method is described in the present embodiment as in the first embodiment, the single-shot echo planar method may be used instead that measures all the echo signals by one time of RF pulse irradiation.

As mentioned above, in accordance with the MRI apparatus and the susceptibility-emphasized imaging method of the present embodiment, it is possible to obtain susceptibility-emphasized images without N/2 artifacts and with a high signal-to-noise ratio, by applying a phase blip gradient magnetic field pulse with respect to every two echo signals and setting the echo signal group measured in odd-numbered order as the first echo signal group and the echo signal group measured in even-numbered order as the second echo signal group.

Third Embodiment

Next, the third embodiment of the MRI apparatus and the susceptibility-emphasized imaging related to the present invention will be described. The present embodiment reduces imaging time by making the number of measurement of echo signals for a mask and the number of measurement of echo signals for an image different. The differences from the first embodiment are the sequence diagram due to the difference of the measurement numbers of echo signals for a mask and echo signals for an image, and the placement of data in the K-space. Only the difference from the first embodiment will be described below.

Figure 10:
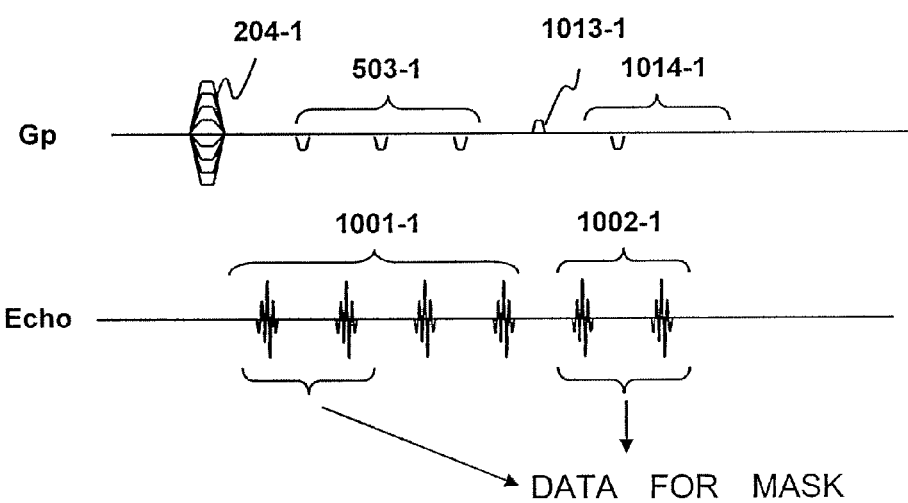
FIG. 10 is for explaining the sequence and the K-space data related to the third embodiment.
Figure 10:
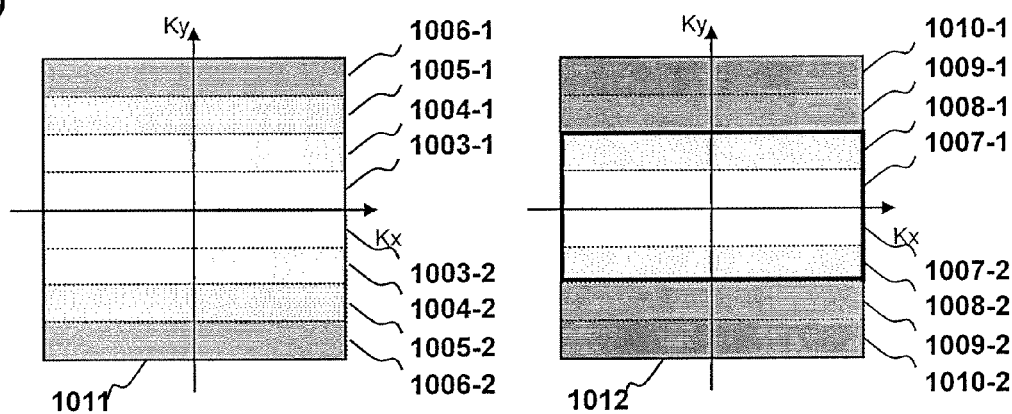

First, the sequence diagram of the present embodiment will be described using FIG. 10(a). FIG. 10(a) shows the sequence diagram by the multi-shot echo planar method of the gradient echo type related to the present embodiment, and only an echo signal (Echo) measured by one repetition (shot). Explanation on the other parts will be omitted since they are the same as the sequence in FIG. 5(a). In the present embodiment, the measurement is executed so that the number of the echo signals for an image and the number of the echo signals for a mask are different. Preferably, the measurement should be executed so that the number of echo signals for a mask is less than the number of echo signals for an image. While FIG. 10(a) shows the case that the number of echo signals 1001 for an image is 4 and the number of echo signals 1002 for a mask is 2 to be measured, the number of echo signals in the present embodiment is not restricted thereto.

As described above, the difference from the sequence in FIG. 5(a) regarding application control of the phase encode gradient magnetic field pulse by sequencer 4 for differentiating the number of measurements of the echo signal groups for an image and for a mask is that the area of re-phasing gradient magnetic field pulse 1013 is different. That is, the application amount of re-phasing gradient magnetic field pulse 1013 which is to be executed after measurement of first echo signal group 1001 and before measurement of second echo signal group 1002 is made smaller than 504 in FIG. 5(a). By doing so, the position of Ky-direction at the point where the second echo signal group is measured starts from the region having higher spatial frequency than the sequence in FIG. 5(a). The size of phase blip gradient magnetic field pulse 1014 to be applied after re-phasing gradient magnetic field pulse 1013 is the same as 505 in FIG. 2(a). Sequencer 4 executes measurement of the respective echo signals by controlling the phase encode gradient magnetic field pulse and the phase blip gradient magnetic field pulse as described above.

When echo signals are measured as described above, data filling rate of the echo signals become different between the K-space for an image and the K-space for a mask. However, since the high-spatial frequency pass filter is applied to the K-space data for a mask in the generation process of a susceptibility-emphasized image, only small amount of information on the low-spatial frequency region is necessary for the K-space data for a mask. Considering the characteristic thereof, it means that only the data of at least a high-spatial frequency region is required for the K-space data for a mask.

Given this factor, the present embodiment places the echo data only in the high-spatial frequency region of the K-space for a mask without measuring the echo signals relevant to the remaining low-spatial frequency region, and uses the same data as the echo data of the relevant low-spatial frequency in the K-space for an image. In other words, CPU 8 fills the echo data corresponding to the low-spatial frequency region in the K-space for an image not only in the relevant K-space for an image but also in the relevant low-spatial frequency region of the K-space for a mask.

FIG. 10(b) shows the K-space data acquired based on the sequence shown in FIG. 10(a). FIG. 10(b) is an example that the measured echo data is placed in the K-space based on the sequence in FIG. 10(a). In this case, the echo data is placed in K-space 1011 for an image as in the previously described first embodiment. That is, CPU 8 places the data of echo signal group 1001 measured by sequencer 4 in K-space 1011 for an image in order of divided regions 1003, 1004, 1005 and 1006.

On the other hand, the data of echo signal group 1002 are placed in K-space 1012 for a mask. That is, CPU 8 places the data of echo signal group 1002 measured by sequencer 4 in K-space 1012 for a mask in order of divided regions 1009 and 1010. However, the echo signals corresponding to divided regions 1007 and 1008 surrounded by a thick frame in K-space 1012 for a mask are not being measured. CPU 8 therefore fills those regions with the same data as the echo data placed in divided regions 1003 and 1004 in the same K-space 1011 for an image within the echo signal group 1001 measured for an image. By doing so, the echo data can be filled in all of the spatial frequency in the K-space for a mask, whereby making it possible to reconstruct an image.

In order to reconstruct a susceptibility-emphasized image using such acquired K-space data 1011 for an image and K-space data 1012 for a mask, the imaging flow in FIG. 6 described in the first embodiment can be applied. The concrete steps will be described below.

In step 601, sequencer 4 controls the measurement of echo signal groups 1001 and 1002 based on the sequence shown in FIG. 10(a), and acquires echo signal group 602.

In step 603, CPU 8 creates K-space data 1011 and 1012 for an image and a mask shown in FIG. 10(b) respectively from echo signal group 602. At this time, CPU 8 shares the data of the low-spatial frequency region in the K-space for a mask and the low-spatial frequency region in the K-space for an image, as described above.

Afterward, susceptibility-emphasized image 413 is obtained by CPU 8 replacing K-space data 605 for an image in FIG. 6 by K-space data 1011 for an image in FIG. 10(b) and replacing K-space data 604 for a mask in FIG. 6 by K-space data 1012 for a mask in FIG. 10(b), and executing the imaging flow after step 403 shown in FIG. 6. The processing content in the respective steps will be omitted since they are the same.

In this regard, however, the characteristic of the data related to the process of the respective steps is different, thus the characteristic of each data generated in the imaging flow in FIG. 6 will be described below.

As described above, since the echo data for an image is included in the low-spatial frequency region of K-space data 1012 for a mask, the echo data at the time point where the echo time is short is also included in K-space data 1012 for a mask. Therefore, the phase of image data 606 for a mask generated in the processing flow of FIG. 6 includes both of the phase of the echo signal measured at the time point where the echo time is short which takes up the low-spatial frequency region and the phase of the echo signal measured at the time point where the echo time is long which takes up the high-spatial frequency region.

On the other hand, since the high-spatial frequency component is eliminated by the filtering from filtered mask data 405 after being performed with low-pass filtering process 403, the phase of the echo signal which takes up the low-spatial frequency region becomes dominant.

Therefore, the phase of echo signal which takes up the high-spatial frequency region becomes dominant in the phase data after being performed with phase subtracting process 408. To be exact, the phase data remained after receiving phase subtracting process 408 is the difference wherein the phase of the echo time when the echo signal to be placed in the low-spatial frequency region is measured is subtracted from the phase of the echo time when the echo signal to be placed in the high-spatial frequency region is measured.

By executing these steps, compared to the case without performing the difference process, the component of the phase rotation attributed to the difference of echo times can be extracted, whereby making it possible to prevent image deterioration due to excessive phase rotation.

The present embodiment can be applied to the other sequences shown in the first embodiment (i.e., FIG. 7(a), FIG. 8 and FIG. 9(a)). In these cases also, by setting more echo signal groups for an image and less echo signal groups for a mask for measuring in 1 shot, upon creating the K-space data for a mask, the data of the lacking echo signals of the spatial frequency region is filled with the echo data of the relevant spatial frequency region in the echo signal group for an image. While the example of the sequence of the multi-shot echo planar method is described in the present embodiment as in the first embodiment, the single-shot echo planar method may be used instead that measures all the echo signals by one time of RF pulse irradiation.

As mentioned above, in accordance with the MRI apparatus of the present embodiment, in the measurement of echo signal groups using the echo planar method, it is possible to obtain the susceptibility-emphasized image with a high signal-to-noise ratio and improved contrast of magnetic susceptibility by omitting the measurement of echo signals equivalent to the low-spatial frequency region in the K-space upon measuring the echo signals for a mask and by sharing the echo data of the low-spatial frequency region in the K-space upon dividing the echo signal groups into the one for an image and the one for a mask.

The invention claimed is:

1. A magnetic resonance imaging apparatus comprising:
a static magnetic field generating unit that generates a static magnetic field in an imaging space in which an object to be examined is disposed;
a gradient magnetic field generating unit that generates gradient magnetic fields in the imaging space;
a transmission unit that irradiates the object with an RF pulse;
a reception unit that receives and detects a nuclear magnetic resonance signal generated from the object;
a measurement controller configured to control the operation of the gradient magnetic field generating unit, the transmission unit and the reception unit to obtain measurement of a plurality of echo signals from the object, based on a predetermined pulse sequence which causes the gradient magnetic fields to include a phase blip gradient magnetic field and a frequency encode gradient magnetic field with an inverted polar character; and
an arithmetic processor configured to divide the plurality of echo signals into a first echo signal group and a second echo signal group, acquire image data from the first echo signal group and mask data from the second echo signal group, and obtain a susceptibility-emphasized image through use of the image data and the mask data.

2. The magnetic resonance imaging apparatus according to claim 1, wherein the arithmetic processor acquires mask image data by Fourier transforming the second echo signal group and acquires filtered mask data by low-pass filtering and Fourier transforming the second echo signal group, so as to acquire the mask data from the difference between the phase of the mask image data and the phase of the filtered mask data.

3. The magnetic resonance imaging apparatus according to claim 1, wherein the arithmetic processor sets the echo signals measured in the anterior side of the pulse sequence as a first echo signal group and the echo signals measured in the posterior side of the pulse sequence as a second echo signal group.

4. The magnetic resonance imaging apparatus according to claim 3, wherein the measurement controller applies a rephasing gradient magnetic field between the measurement of the first echo signal group and the measurement of the second echo signal group.

5. The magnetic resonance imaging apparatus according to claim 3, wherein the arithmetic processor shares a part of the plurality of echo signals between the first echo signal group and the second echo signal group.

6. The magnetic resonance imaging apparatus according to claim 5, wherein the measurement controller makes the polar characteristic of the phase blip gradient magnetic field to be applied upon measurement of the first echo signal group and the polar characteristic of the phase blip gradient magnetic field to be applied upon measurement of the second echo signal group different.

7. The magnetic resonance imaging apparatus according to claim 3, wherein the measurement controller increases intensity of the frequency encode gradient magnetic field to be applied and reduces the application time upon measurement of the second echo signal group compared to the frequency encode gradient magnetic field to be applied upon measurement of the first echo signal group, and broadens reception frequency bandwidth of a sampling window upon measurement of the second echo signal group compared to the reception frequency bandwidth of a sampling window upon measurement of the first echo signal group.

8. The magnetic resonance imaging apparatus according to claim 1, wherein the arithmetic processor, from among the plurality of echo signals, sets the echo signals measured in the odd-numbered order as the first echo signal group and sets the echo signals measured in the even-numbered order as the second echo signal group.

9. The magnetic resonance imaging apparatus according to claim 8, wherein the measurement controller applies the phase blip gradient magnetic field with respect to every two echo signals.

10. The magnetic resonance imaging apparatus according to claim 1, wherein the measurement controller makes the number of echoes in the first echo signal group and the number of echoes in the second echo signal group different.

11. The agnetic resonance imaging apparatus according to claim 10, wherein:
the measurement controller measures only the echo signals corresponding to a high-spatial frequency region in the K-space with respect to the second echo signal group; and
the arithmetic processor uses the data of the echo signals corresponding to the same low-spatial frequency region in the first echo signal group as the data of the echo signal corresponding to the low-spatial frequency region in the K-space with respect to the second echo signal group.

12. A susceptibility-emphasized imaging method performed by a magnetic resonance imaging apparatus, the method comprising:
a measurement step that measures a plurality of echo signals from an object to be examined based on a predetermined pulse sequence which causes a phase blip gradient magnetic field and a frequency encode gradient magnetic field with an inverted polar character, to be applied; and
an arithmetic processing step that divides the plurality of echo signals into a first echo signal group and a second echo signal group, acquires image data from the first echo signal group and mask data from the second echo signal group, and obtains a susceptibility-emphasized image through use of the image data and the mask data.

13. The susceptibility-emphasized imaging method according to claim 12, wherein the arithmetic processing step, from among the plurality of echo signals, sets the echo signal measured in the anterior side of the pulse sequence as a first echo signal group, and sets the echo signals measured in the posterior side as a second echo signal group.

14. The susceptibility-emphasized imaging method according to claim 12, wherein the arithmetic processing step, from among the plurality of echo signals, sets the echo signals measured in the odd-numbered order as the first echo signal group, and sets the echo signals measured in the even-numbered order as the second echo signal group.

15. The susceptibility-emphasized imaging method according to claim 12, wherein the measurement step makes the number of echo signals in the first echo signal group and the number of echo signals in the second echo signal group different.

\* \* \* \* \*